United States Patent [19]
Endo

[11] Patent Number: 4,996,502
[45] Date of Patent: Feb. 26, 1991

[54] ULTRASONIC ATOMIZER CIRCUIT HAVING PLURAL OSCILLATORS

[75] Inventor: Shinichi Endo, Chiba, Japan

[73] Assignee: TDK Corporation, Tokyo, Japan

[21] Appl. No.: 415,102

[22] Filed: Sep. 29, 1989

[30] Foreign Application Priority Data

Oct. 1, 1988 [JP] Japan .......................... 63-128015[U]

[51] Int. Cl.$^5$ ..................... H03B 5/36; B05B 17/06
[52] U.S. Cl. .................. 331/46; 128/200.16; 239/102.2; 310/317; 331/56; 331/116 R
[58] Field of Search .................. 128/200.16; 310/316, 310/317, 319; 331/46, 56, 116 R; 239/102.2; 261/DIG. 48

[56] References Cited

U.S. PATENT DOCUMENTS 3,989,042 11/1976 Mitsui et al. .................. 128/194
4,054,848 10/1977 Akita .................. 310/317 X
4,641,053 2/1987 Takeda .................. 310/317

FOREIGN PATENT DOCUMENTS 60-12619 4/1985 Japan .

Primary Examiner—Siegfried H. Grimm
Attorney, Agent, or Firm—Martin M. Novack

[57] ABSTRACT

An ultrasonic atomizer circuit having a plurality of unit oscillator circuits has been improved by preventing undesired interference between oscillator circuits. Each unit oscillator circuit has a transistor (Q1) with a grounded collector, a piezo-electric vibrator (TD) coupled across the collector and the base of the transistor (Q1), a capacitor (C3) coupled across the emitter and the base of the transistor (Q1), and a capacitor (C1) coupled across the emitter and the collector of the transistor (Q1). An additional capacitor (C7) is provided between the base of the transistor (Q1) and the junction point of one end of the vibrator (TD) and the capacitor (C3), so that one end of said capacitor (C3) is separated from the base of the transistor for DC current.

4 Claims, 7 Drawing Sheets ically, the present invention relates to a self-oscilla-
ULTRASONIC ATOMIZER CIRCUIT HAVING PLURAL OSCILLATORS

BACKGROUND OF THE INVENTION

The present invention relates to a nebulizer, or an ultrasonic atomizer which converts water to mist. In particular, the present invention relates to a self-oscillation circuit for energizing a piezo-electric vibrator.

A prior self oscillation circuit for energizing a piezoelectric vibrator for a nebulizer is shown in Japanese utility model publication No. 12619/85 and/or U.S. Pat. No. 3,989,042. That circuit has been used for conveniently providing moisture in a room.

FIG. 4 shows a prior nebulizer circuit which is a grounded collector transistor type self oscillation circuit (Colpitts oscillation circuit). In the figure, the symbol Q1 is a transistor, R1 through R6 are resistors, C1 through C6 are capacitors, L1 through L3 are inductors, and TD is a piezo-electric vibrator for generating ultrasonic wave vibration. The vibrator TD is mounted at a bottom of a water tank which contains water to be atomized, and therefore, one of the electrodes of said vibrator is coupled with a collector of the transistor Q1, and said electrode contacts directly with water. The oscillation circuit of FIG. 4 is supplied with D.C. voltage which is obtained by rectifying A.C. voltage (for instance A.C. 48 volts) by using a fullwave rectifier DS. Exactly speaking, the supply voltage is pulsating voltage, but is not flat DC voltage, since the capacitance C1 is rather small and not enough for supplying flat DC voltage, for reducing the manufacturing cost of the circuit. The capacitance C1 is for instance 0.1 μF, which operates to short-circuit between the collector of the transistor Q1 and the junction point of the inductor L1 and the resistor R3 for the oscillation frequency (for instance 1.65 MHz) of the vibrator TD.

The inductor L3 and the capacitor C4 coupled with a base circuit of the transistor Q1 operates as a noise filter, which is useful to prevent noise on a line between the junction point of the resistors R2 and R3, and the base circuit of the transistor Q1. That line might be long, when a variable resistor for adjusting amount of mist is coupled between said junction point and said base circuit, and might induce undesirable noise.

A small nebulizer which atomizes 400 cc/hour, or 500 cc/hour used in an ordinary house has a single nebulizer circuit of FIG. 4 for each nebulizer. There are no problems in that case.

On the other hand, a large nebulizer which atomizes more water has a plurality of oscillation circuits. If there is no interference among those oscillation circuits, the amount of water to be atomized by said large nebulizer is n times of that of a single oscillation circuit, where n is a number of oscillation circuits.

However, when a power transformer PT is used commonly for all the oscillation circuits as shown in FIG. 5, we have realized the following disadvantages.

FIG. 6 shows operational waveforms of the circuit of FIG. 5. FIG. 6A shows the waveform at the point T at one end of the vibrator TD. That waveform is the pulsation voltage having the period of 10 mS (100 Hz) which is twice of the power supply frequency (in case of fullwave rectification). A small drift D is observed in the waveform in FIG. 6A because of the saturation voltage between the collector and the emitter of the transistor Q1. The drift D is not important in the present invention.

FIG. 6B is the enlarged view of the portion X of FIG. 6A.

The high frequency vibration of 1.65 MHz which is applied to the vibrators TD is observed in FIG. 6A and 6B.

It should be noted in those figures, in particular in FIG. 6B, that the amplitude of the high frequency signal of 1.65 MHz fluctuates with about 20 kHz (period is 20 μS). That fluctuation frequency of 20 kHz depends upon a value of circuit elements, and distributes between 5kHz and 100 kHz. That undesired ripple fluctuation decreases the amount of the mist, since the vibrator is not energized by the full voltage at the portion Z where the voltage applied to the vibrator TD is rather low. The amplitude of that ripple voltage depends upon the value of circuit elements, and is high enough to decrease the amount of the mist considerably.

The amplitude of the waveform of FIG. 6A and FIG. 6B is 100–150 volts when the power supply voltage is 48 volts ($2 \times 1.41 \times 48$). However, the amplitude of the fluctuation is not small as compared with that of the voltage, and the fluctuation decreases the amount of the mist.

That undesired ripple voltage is observed whether vibrators are mounted on separate water tanks, or they are mounted on a large common water tank.

In FIG. 5, the conductor GD which couples all the collectors of all the transistors commonly is provided by the conductive water in a tank. We have also observed that when the collectors of all the transistors are coupled commonly with a conductor line GD, the ripple vibration is strong. However, even if the conductor line GD is not used and a plurality of separate water tanks are used, the ripple is observed as far as a plurality of oscillation circuits are coupled with a common rectifier which is connected to a single transformer.

As mentioned above, a prior oscillation circuit has the disadvantage that when a plurality of oscillation circuits are coupled with a single common power transformer PT, since those oscillation circuits interfer with one another, an undesired ripple oscillation of 5 kHz–100 kHz is generated. Thus, the total amount of mist is less than n times of that of each of the oscillation circuits, even when n number of oscillation circuits are used. Further, the amount of decrease of mist depends upon circuit elements, and the accurate design of the amount of mist was impossible.

SUMMARY OF THE INVENTION

It is an object, therefore, of the present invention to overcome the disadvantages and limitations of a prior nebulizer circuit by providing a new and improved nebulizer circuit.

It is also an object of the present invention to provide a nebulizer circuit which can generate n times of mist when n number of oscillation circuits are used.

The above and other objects are attained by an ultrasonic atomizer circuit comprising a plurality of unit oscillation circuits each coupled commonly with a secondary winding of a single common transformer (PT) through a rectifier circuit (DS), each of said unit oscillator circuits comprising a transistor (Q1) with a collector grounded, a piezo-electric vibration element (TD) coupled across a collector and a base of said transistor, a capacitor C1 coupled across an emitter and said collector of said transistor (Q1), and a capacitor (C3) coupled across said base and said emitter of said transistor (Q1), wherein another capacitor (C7) coupled between junction point of one end of said vibrator (TD) and one end of said capacitor (C3), and the base of said transistor (Q1), so that said capacitor (C3) is separated from a base circuit of the transistor (Q1) for DC current.

BRIEF DESCRIPTION OF THE DRAWINGS

The foregoing and other objects, features, and attendant advantages of the present invention will be appreciated as the same become better understood by means of the following description and accompanying drawings wherein.

DESCRIPTION OF THE PREFERRED EMBODIMENTS

Figure 1A:
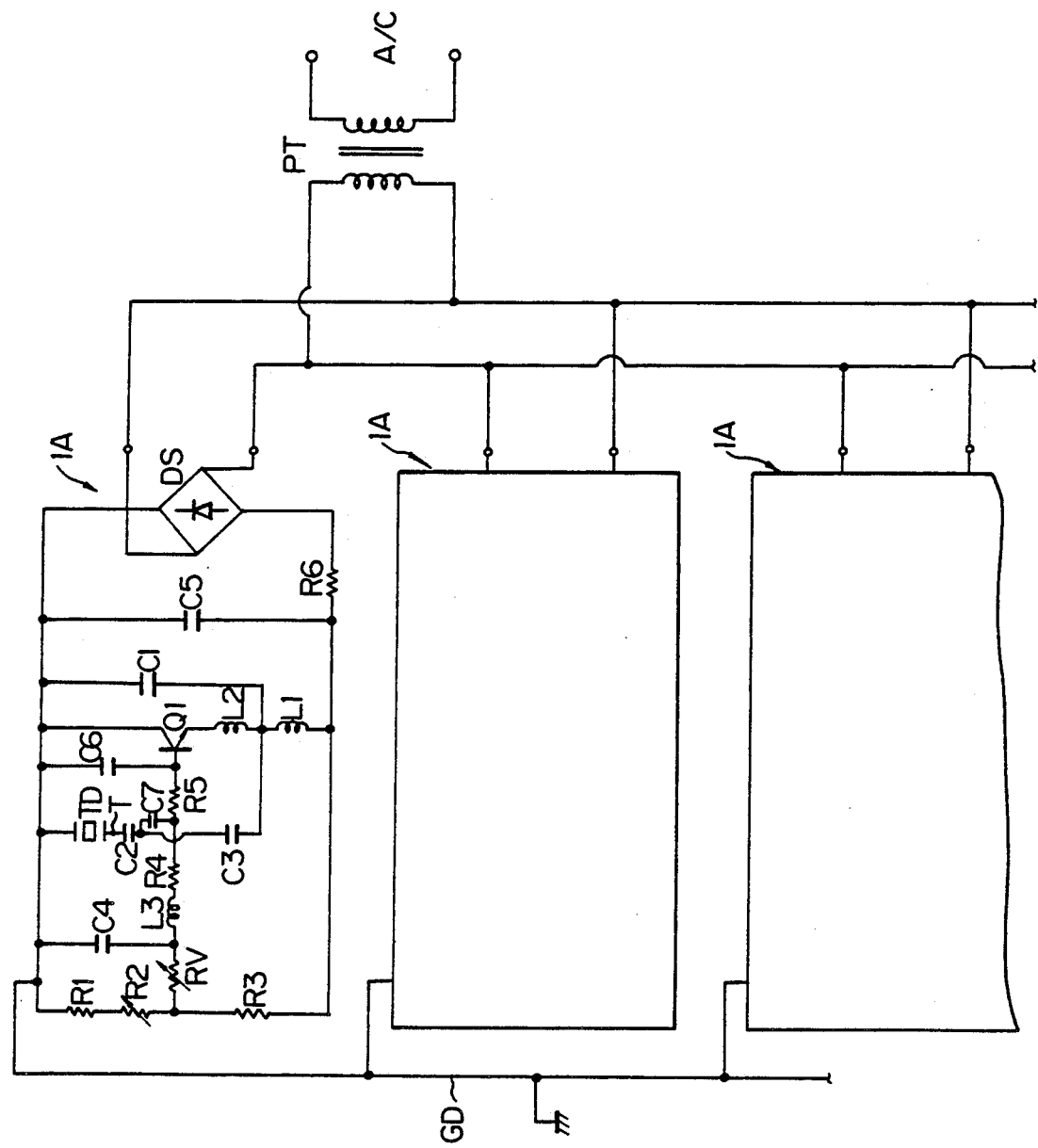
FIG. 1A is a circuit diagram of an oscillation circuit for a nebulizer according to the present invention.

FIG. 1A shows a circuit diagram of an oscillation circuit according to the present invention. In the figure, the piezoelectric vibrator TD, a self exciting grounded collector type transistor oscillator for exciting said vibrator, and, a rectifier DS, provide a unit circuit 1A. And, a plurality of unit circuits 1A are coupled in parallel with the secondary winding of a transformer PT.

Figure 1B:
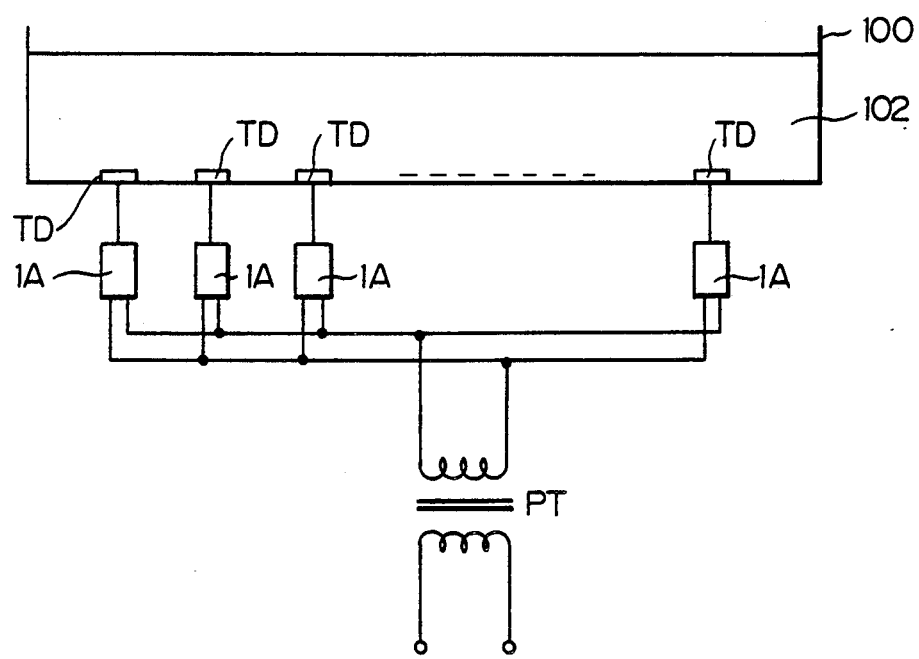
FIG. 1B shows a nebulizer using the circuit of FIG. 1A.

FIG. 1B shows an atomizer unit utilizing the circuit of FIG. 1A. In FIG. 1B, the numeral 100 is a water tank containing water 102 which is to be atomized. A plurality of vibrators TD are mounted on the bottom of the tank 100, and each vibrator is coupled with a unit oscillation circuit 1A as shown in the figure. All the unit oscillation circuits 1A are commonly coupled with a single transformer PT for power supply.

Figure 4:
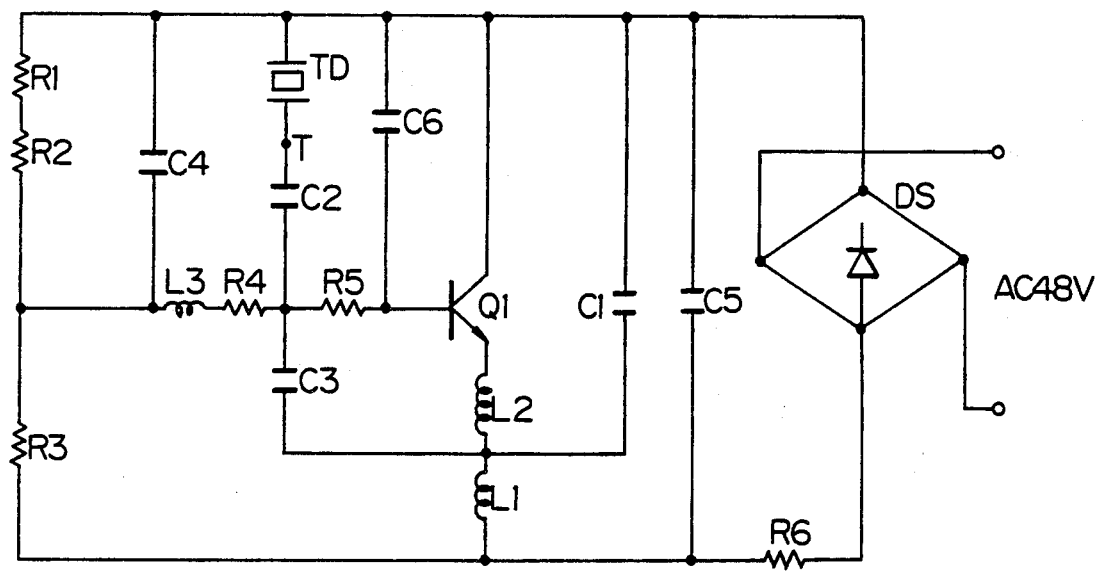
FIG. 4 is a prior oscillation circuit for a nebulizer.

The self exciting transistor oscillator 1A is a Colpitts circuit, similar to FIG. 4A in the U.S. Pat. No. 3,989,042. The piezo-vibrator TD which is inductive on operational frequency, a pair of capacitors C1 and C3, and a transistor Q1 constitute a basic Colpitts oscillation circuit. The oscillation frequency for the atomizer is for instance 1.65 MHz. The capacitor C5 has very small impedance for that oscillation frequency.

Figure 5:
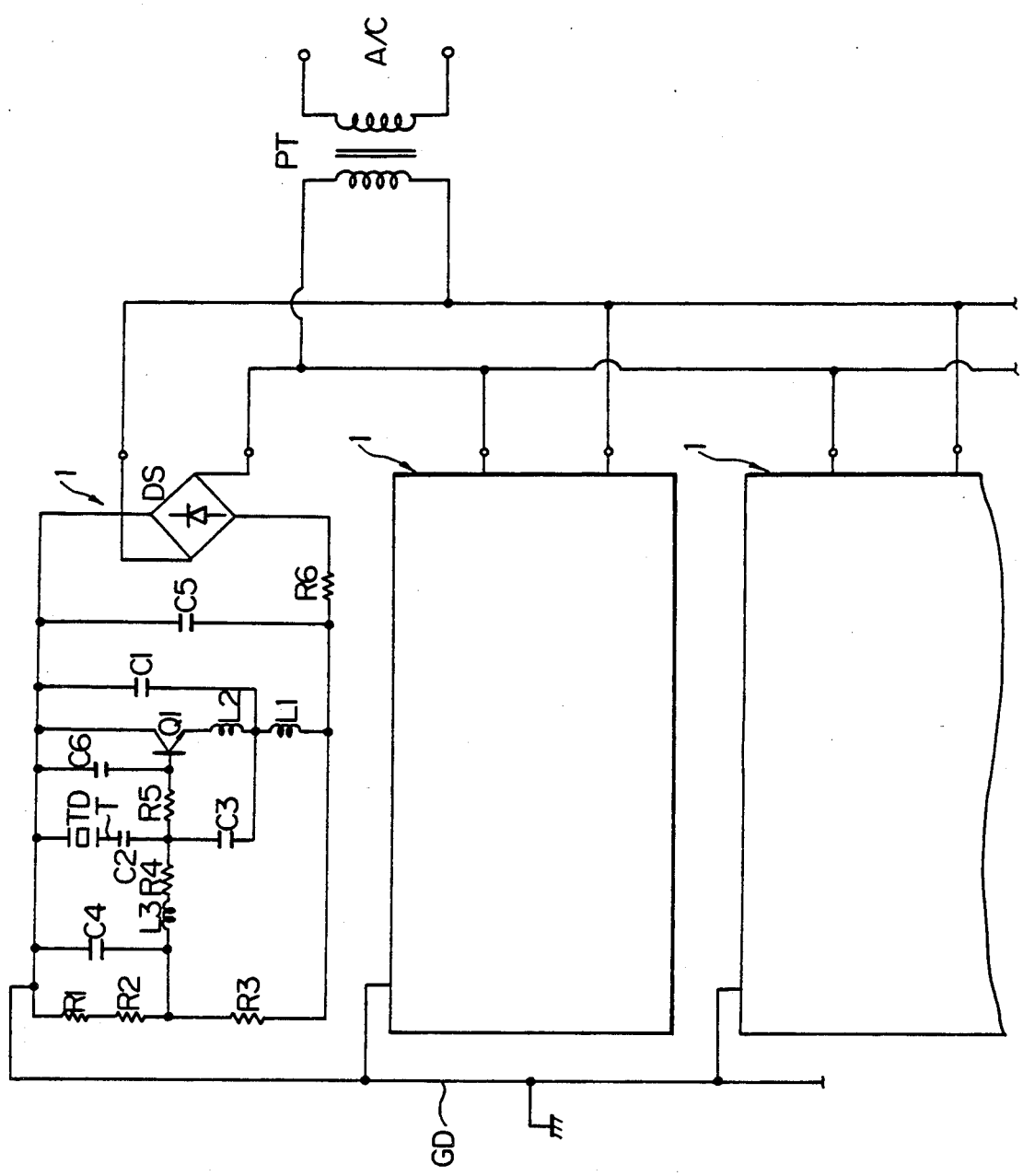
FIG. 5 is another prior circuit of an oscillation circuit for a nebulizer.
Figure 6A:
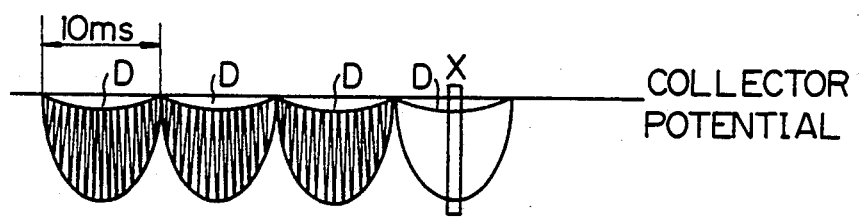
FIGS. 6A and 6B show operational waveforms of the circuit of FIG. 5.
Figure 6B:
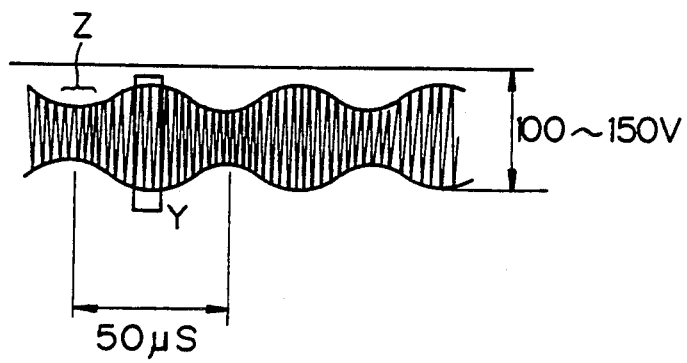

One end of the vibrator TD contacting the water to be atomized is connected to the collector of the transistor Q1, and the other end of the vibrator TD is connected to the capacitor C2. The junction point of the capacitors C2 and C3 is coupled with the base of the transistor Q1 through the capacitor C7 and the resistor R5. Therefore, the capacitor C3 is separated from the base bias circuit which provides the base bias current to the transistor Q1 by the presence of the capacitor C7 in the sense of D.C. (direct current). Other structures of FIG. 1 are the same as that of FIG. 5.

The main oscillation loop in the unit oscillator has the vibrator TD, and the capacitors C2, C3 and C1. The ripple noise component from other unit oscillators come to the circuit through the parallel circuit of the capacitor C4 and the resistors R1 and R2, and the series circuit of the inductor L3 and the resistor R4.

It should be noted that the ripple noise of the frequency 5 kHz-100 kHz at the end of the resistor R4 does not charge the capacitor C3, which is the component of the main oscillation loop.

Therefore, even when a plurality of unit oscillators 1A are connected commonly to the secondary winding of the common transformer PT, no abnormal oscillation occurs, and the amplitude of the high frequency voltage across the vibrator TD is stable. Thus, the amount of the mist is not reduced because of the interference of the unit oscillators.

The functions of various elements in FIG. 1A are as follows. The inductor L1 functions to prevent high frequency excessive current in the transistor Q1, the inductor L2 functions to shape the waveform of the emitter current, the capacitor C2 functions to protect the transistor from breakdown when the vibrator TD is short circuited, the resistor R5 functions to prevent noise and shape the waveform of the base current of the transistor Q1, the resistor R4 functions to prevent the drift of the base potential of the transistor Q1 during the charge and discharge operation of the capacitor C4, the inductor L3 and the capacitor C4 function as a noise filter for preventing noise from the bias circuit (R1, R2, R3, RV) to the transistor circuit. The resistors R1, R2, R3 and RV function to provide proper operational bias voltage to the base of the transistor Q1. The resistor R2 may be a variable resistor for compensating minor error in the characteristics of the transistor Q1. The variable resistor RV function to adjust manually the amount of mist.

The preferable numerical embodiment of the circuit elements in FIG. 1A is as follows.

| Capacitor C1; | 1800 pF | Capacitor C2; | 47000 pF |
|---|---|---|---|
| Capacitor C3; | 47000 pF | Capacitor C4; | 10000 pF |
| Capacitor C5; | 0.1 μF | Capacitor C6; | 100 pF |
| Inductor L1; | 22 μH | Inductor L2; | 0.1 μH |
| Inductor L3; | 100 μH | | |
| Resistor R1; | 5.6 Kohms | Resistor R2; | 200-10 Kohms |
| Resistor R3; | 6.8 Kohms | Resistor R4; | 68 ohms |
| Resistor R5; | 3.3 ohms | Resistor R6; | 0.47 ohm |

Figure 2:
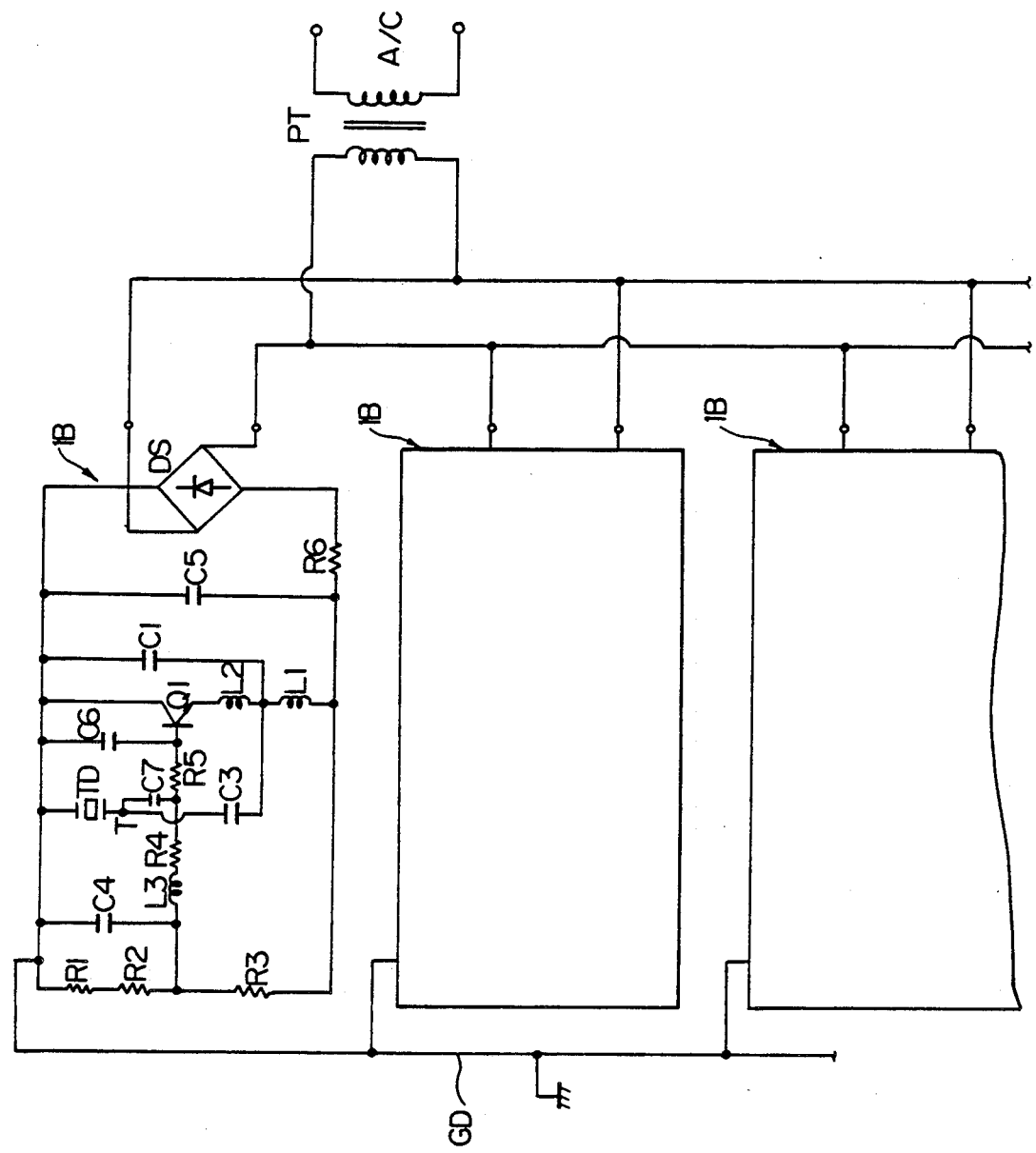
FIG. 2 is a circuit diagram of another embodiment according to the present invention.

FIG. 2 shows another embodiment of the present oscillation circuit, in which the unit oscillation circuit 1B has no capacitor C2, and the end of the vibrator TD is directly connected to the capacitor C3.

The capacitor C2 in FIG. 1 functions to prevent the damage of the transistor Q1 by the current to the base of the transistor through the resistor R5 when the vibrator TD is short-circuited by accident. As the embodiment of FIG. 2 has the capacitor C7, that capacitor C7 doubles as that capacitor C2, and no current is applied to the base circuit of the transistor Q1 even when the vibrator TD is short-circuited. Other structure of FIG. 2 is the same as that of FIG. 1A.

Figure 3:
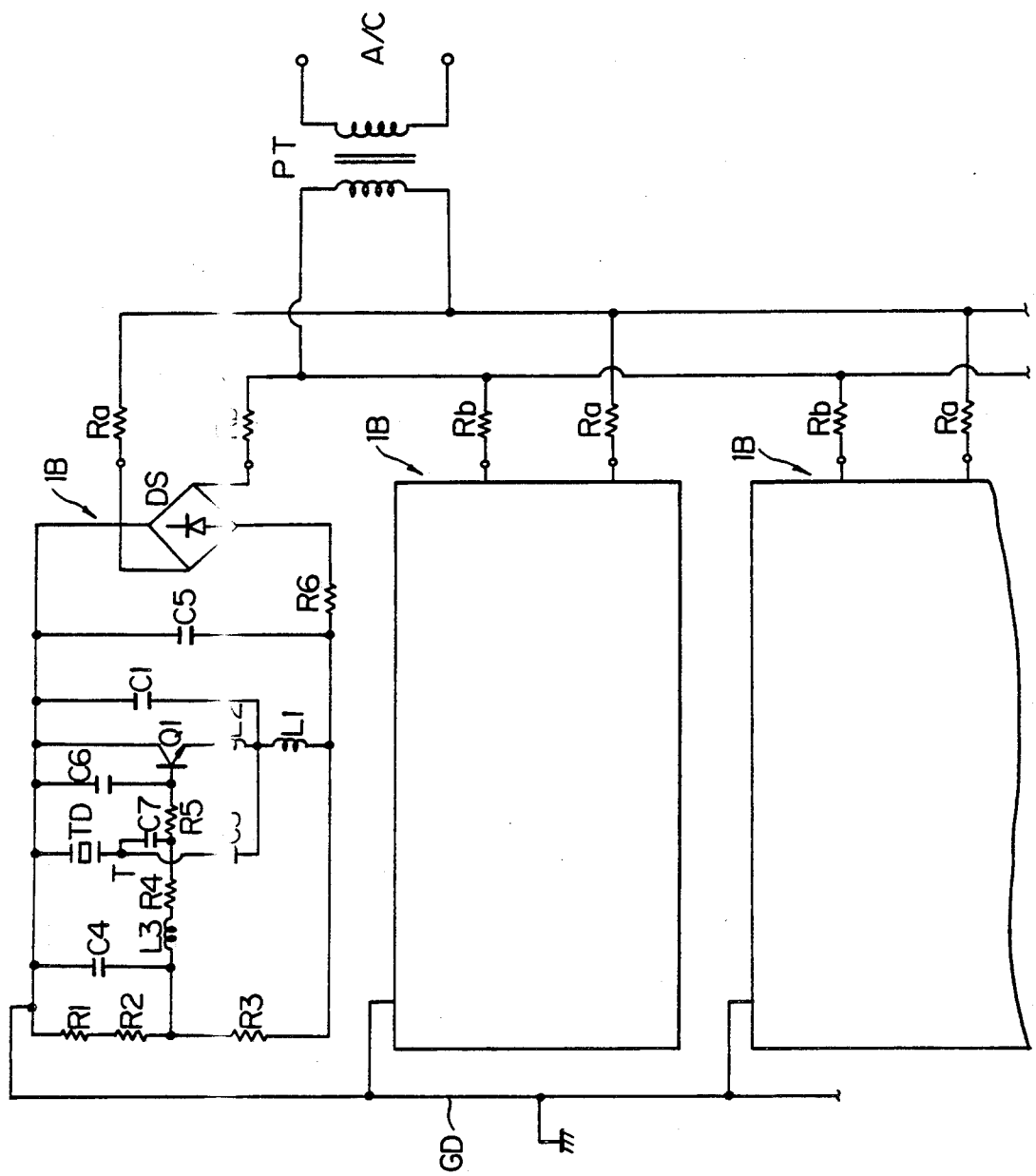
FIG. 3 is a circuit diagram of still another embodiment of a nebulizer circuit according to the present invention.

FIG. 3 shows still another embodiment of the oscillation circuit according to the present invention. The feature of FIG. 3 is the presence of the resistors Ra and Rb between the rectifier DS and the secondary winding of the power transformer PT. The resistance of those resistors is in the range between 0.1 ohm and 3 ohms.

The operation of the resistors Ra and Rb are analyzed as follows.

The undesired oscillation frequency component of 5 kHz-100 kHz is generated by the charge and discharge of the capacitor C3, which changes the collector current of the transistor Q1 through the base of the transistor Q1. The collector current does not feed-back to the base through the capacitor C1, the vibrator TD, or the capacitor C5, since the capacitance of those elements is too small to establish the feed-back and the oscillation. That collector current does not feed-back through the power transformer PT, since the power transformer has large inductance, which attenuates the undesired high frequency oscillation. Therefore, no undesired oscillation occurs when a single unit oscillator is used, so long as a power transformer is used as a power supply.

On the other hand, when a plurality of unit oscillators are connected to a common power transformer, the collector current is fed-back to the collector itself through the emitter, the inductor L2, the inductor L1, the resistor R6, the rectifier DS, the rectifier DS of another unit oscillator, the base bias circuit of another unit oscillator, the emitter of another unit oscillator, the inductor L2 of another unit oscillator, the inductor L1 of another unit oscillator, and resistor R6 of another unit oscillator, the rectifier DS of another unit oscillator, the rectifier DS of the own unit rectifier, and the transistor Q1 in the own unit oscillator. The presence of the resistors Ra and Rb in that feed-back loop attenuates the undesired oscillation, and prevents that undesired oscillation.

As described above in detail, according to the present invention, no interference among a plurality of unit oscillators occurs, and no decrease of oscillation energy, nor the decrease of the amount of the mist occurs. And, a sufficient amount of mist is obtained by using a plurality of unit oscillators.

From the foregoing, it will now be apparent that a new and improved ultrasonic nebulizer circuit has been found. It should be understood of course that the embodiments disclosed are merely illustrative and are not intended to limit the scope of the invention. Reference should be made to the appended claims, therefore, rather than the specification as indicating the scope of the invention.

What is claimed is:

1. An ultrasonic atomizer circuit comprising a plurality of unit oscillation circuits each coupled commonly with a secondary winding of a single common transformer (PT) through a rectifier circuit (DS), each of said unit oscillator circuit comprising a transistor (Q1) with a grounded collector, a piezo-electric vibration element (TD) coupled across said collector and a base of said transistor, a capacitor C1 coupled across an emitter and said collector of said transistor (Q1), and a capacitor (C3) coupled across said base and said emitter of said transistor (Q1), wherein the improvement comprises another capacitor (C7) coupled between a junction point of one end of said vibration element (TD) and one end of said capacitor (C3), and the base of said transistor (Q1), so that said capacitor (C3) is separated from said base circuit of the transistor (Q1) for DC current.

2. An ultrasonic atomizer circuit according to claim 1, wherein a further capacitor (C2) is provided between said one end of said vibrator (TD) and said one end of said capacitor (C7).

3. An ultrasonic atomizer circuit according to claim 1, wherein a resistor is inserted between said rectifier circuit (DS) and said secondary winding of the transformer PT.

4. An ultrasonic atomizer circuit according to claim 3, wherein the resistance of said resistor is in a range between 0.1 ohm and 3 ohms.

* * * * *